(12) United States Patent
Yaegashi et al.

(10) Patent No.: US 6,376,861 B1
(45) Date of Patent: Apr. 23, 2002

(54) THIN FILM TRANSISTOR AND METHOD FOR FABRICATING THE SAME

(75) Inventors: Hiroyuki Yaegashi; Takuya Watanabe; Tetsuya Kida; Akira Komorita, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/713,890

(22) Filed: Nov. 16, 2000

(30) Foreign Application Priority Data

Feb. 10, 2000 (JP) ........................................ 2000-033151

(51) Int. Cl.$^7$ .................... H01L 29/04; H01L 31/20; H01L 31/036; H01L 31/0376
(52) U.S. Cl. .................... 257/59; 257/72; 257/350; 257/412; 257/762; 257/763; 257/764; 257/765; 438/155
(58) Field of Search ...................... 257/59, 72, 412, 257/350, 762, 763, 764, 765; 438/155, 162

(56) References Cited

U.S. PATENT DOCUMENTS 6,255,706 B1 * 7/2001 Watanabe et al. ............ 257/412
6,297,520 B1 * 10/2001 Kubo et al. .................... 257/72

* cited by examiner

Primary Examiner—Ngân V. Ngô
(74) Attorney, Agent, or Firm—Greer, Burns & Crain, Ltd.

(57) ABSTRACT

A thin film transistor comprises a gate electrode 18 formed on a substrate 10, a gate insulation film 20, a semiconductor layer 22, a source electrode 36a and a drain electrode 36b. The gate electrode, the source electrode or the drain electrode include a first conductor film 12, a second conductor film 14 and a third conductor film 16. The first conductor film is formed of a metal selected out of Al, Cu and Ag, or an alloy of a metal, as a main component, selected out of Al, Cu and Ag, and has the side surfaces sloped. The second conductor film is formed of a film of Mo containing nitrogen, or an alloy of Mo, as a main component, containing nitrogen, and has the side surfaces sloped. The third conductor film is formed of Mo or an alloy of Mo as a main component.

14 Claims, 11 Drawing Sheets

THIN FILM TRANSISTOR AND METHOD FOR FABRICATING THE SAME

BACKGROUND OF THE INVENTION

The present invention relates to a thin film transistor and a method for fabricating the thin film transistor, more specifically to a highly reliable thin film transistor using low resistance wiring, and a method for fabricating the thin film transistor.

Liquid crystal display devices have an advantage that they are thin and light, and can be operated at low voltages with small current consumption. Recently liquid crystal display devices are widely used as displays of personal computers, etc.

Generally, the display panels of liquid crystal display devices are each constituted with two transparent glass substrates and liquid crystal sealed between the two transparent glass substrates. On one of the opposed sides of the two glass substrates a black matrix, a color filter, an opposed electrode, an alignment film, etc. are formed, and thin film transistors, picture element electrodes and an alignment film are formed on the other of the opposed sides of the two glass substrates.

Polarization plates are adhered respectively to the sides of the two glass substrates, which are opposite to the opposed sides. The polarization axes of the two polarization plates are arranged normal to each other to provide a liquid crystal display of normally white mode. That is, light is transmitted when no electric filed is applied to the liquid crystal, and when an electric field is applied to the liquid crystal, light is shaded. On the other hand, the polarization axes of the two polarization plates are parallel with each other to provide the liquid crystal device of normally black mode. That is, light is shaded with no electric field applied to the liquid crystal, and light is transmitted with an electric field applied to the liquid crystal.

A conventional liquid crystal display device will be explained with reference to FIGS. 11A and 11B. FIG. 11A is a plan view of a conventional active matrix substrate of the invert stagger type. FIG. 11B is a sectional view of the active matrix substrate along the line A–A' in FIG. 11A.

As shown in FIG. 11B, a gate electrode 118 is formed of an Al film 112 and an Mo film 116 on a glass substrate 110. As shown in FIG. 11A, the gate electrode 118 is connected to a gate bus line 118a of the same conductor films.

Al film 112 is used as a material of the gate electrode 118 because Al has low electric resistance. In the conventional liquid crystal devices Cr, etc., which are metals of relatively high electric resistance and high melting point, have been used. Recently, in accordance with large scales and higher definition of the liquid crystal display devices, low resistance materials, such as Al, etc., are used.

The Mo film 116 is formed on the Al film 112 because Mo has high heat resistance and makes good electric contact with the Al film 112 with the other wiring, etc. The gate bus line 118a is connected to TAB through ITO (Indium Tin Oxide) in a region not shown, but is connected to other wiring, etc. through the Mo film 116. The gate bus line 118a can have good electric contact.

A gate insulation film 120 is formed on the glass substrate 110 with the gate electrode 118 formed on. An amorphous silicon film 122 is formed on the gate insulation film 120. A channel protection film 124 is formed on the amorphous silicon film 122. An n$^+$-amorphous silicon film 126 is formed on the amorphous silicon film 122 with the channel protection film 124 formed on. A source electrode 136a and a drain electrode 136b are formed of an Mo film 128, an Al film 130 and an Mo film 134 on the n$^+$-amorphous silicon film 126. As shown in FIG. 11A, the drain electrode 136b functions as a data bus line.

A protection film 138 is formed on the gate insulation film 120 with the source electrode 136a and the drain electrode 136b formed on. A contact hole 140 arriving at the source electrode 136a is formed in the protection film 138. A picture element electrode 142 is formed of ITO on the protection film 138 connected to the source electrode 136a through the contact hole 140. The Al film 130 is connected to the picture element electrode 142 through the Mo film 134, and the electric contact is good.

As described above, in the conventional liquid crystal display device shown in FIGS. 11A and 11B, Al, which is a low resistance metal, is used as a material of the gate bus line and the data bus line, and is suitable for larger scales and higher definition.

However, in the liquid crystal display device shown in FIGS. 11A and 11B, the side surfaces of the Mo film 116 of the gate electrode 118 is acute, which makes the step coverage of the gate insulation film 120 poor. Film quality of the gate insulation film 120 is interrupted near the side surfaces of the Mo film 116. Accordingly, the gate insulation film 120 has low dielectric voltage resistance.

The side surfaces of the Mo film 134 of the source-drain electrodes 136a, 136b are acute, which makes it difficult to form the protection film 138 in good quality. The protection film 128 has low dielectric voltage resistance.

SUMMARY OF THE INVENTION

An object of the present invention is to provide a thin film transistor which uses a low resistance metal as a material of the gate electrodes and wiring but can ensure high reliability, and a method for fabricating the thin film transistor.

The above-described object is attained by a thin film transistor comprising a gate electrode formed on a substrate, a gate insulation film formed on the gate electrode, a semiconductor layer formed on the gate insulation film, and a source electrode and a drain electrode formed on the semiconductor layer, the gate electrode, the source electrode or the drain electrode including a first conductor film, a second conductor film formed on the first conductor film, and a third conductor film formed on the second conductor film; the first conductor film being formed of a metal selected out of Al, Cu and Ag, or an alloy of a metal, as a main component, selected out of Al, Cu and Ag, and having side surfaces sloped; the second conductor film being formed of a film of Mo containing nitrogen, or an alloy of Mo containing nitrogen, and having side surfaces sloped; and the third conductor film being formed of Mo, or an alloy of Mo as a main component. The gate insulation film is formed on the gate electrode having the side surfaces generally sloped, whereby film quality of the gate insulation film is prevented from being interrupted near the side surfaces of the gate electrode. The gate insulation film can be highly reliable and can have high dielectric voltage resistance. The thin film transistor can be highly reliable.

The above-described object is attained by a thin film transistor comprising a gate electrode formed on a substrate, a gate insulation film formed on the gate electrode, a semiconductor layer formed on the gate insulation film, and a source electrode and a drain electrode formed on the semiconductor layer, the gate electrode, the source electrode or the drain electrode including a first conductor film, and a second conductor film formed on the first conductor film; the first conductor film being formed of a metal selected out of Al, Cu and Ag, or an alloy of a metal, as a main component, selected out of Al, Cu and Ag, and having side surfaces sloped; the second conductor film including a lower layer formed of a film of Mo containing nitrogen or an alloy of Mo, as a main component, containing nitrogen, and an upper layer formed of a film of Mo or an alloy of Mo, as a main component, and side surfaces of the lower layer being sloped. The gate insulation film is formed on the gate electrode having the side surfaces generally sloped, whereby film quality of the gate insulation film is prevented from being interrupted near the side surfaces of the gate electrode. The gate insulation film can be highly reliable and can have high dielectric voltage resistance. The thin film transistor can be highly reliable.

The above-described object is attained by a method for fabricating a thin film transistor comprising the steps of forming a gate electrode on a substrate, forming an gate insulation film on the gate electrode, forming a semiconductor layer on the gate insulation film, and forming a source electrode and a drain electrode on the semiconductor layer, the step of forming the gate electrode, or the step of forming the source electrode and a drain electrode including the steps of: forming a first conductor film of a metal selected out of Al, Cu and Ag, or an alloy of a metal, as a main component, selected out of Al, Cu and Ag; forming a second conductor film of Mo containing nitrogen or an alloy of Mo, as a main component, containing nitrogen; forming a third conductor film of Mo or an alloy of Mo as a main component; and etching the second conductor film at a higher etching rate than the first conductor film, and etching the third conductor film at a higher etching rate than the second conductor film to thereby slope side surfaces of the first conductor film and of the second conductor film. The gate insulation film is formed on the gate electrode having the side surfaces generally sloped, whereby film quality of the gate insulation film is prevented from being interrupted near the side surfaces of the gate electrode. The gate insulation film can be highly reliable and can have high dielectric voltage resistance. The thin film transistor can be highly reliable.

The above-described object is attained by a method for fabricating a thin film transistor comprising the steps of forming a gate electrode on a substrate, forming an gate insulation film on the gate electrode, forming a semiconductor layer on the gate insulation film, and forming a source electrode and a drain electrode on the semiconductor layer, the step of forming the gate electrode, or the step of forming the source electrode and the drain electrode including the steps of: forming a first conductor film of a metal selected out of Al, Cu and Ag, or an alloy of a metal, as a main component, selected out of Al, Cu and Ag; forming a second conductor film including a lower layer of Mo containing nitrogen or an alloy of Mo, as a main component, containing nitrogen, and an upper layer of Mo or an alloy of Mo as a main component; and etching the lower layer of the second conductor film at a higher etching rate than the first conductor film, and etching the upper layer of the second conductor film at a higher etching rate than the lower layer of the second conductor film to thereby slope side surfaces of the first conductor film and side surfaces of the lower layer of the second conductor film. The gate insulation film is formed on the gate electrode having the side surfaces generally sloped, whereby film quality of the gate insulation film is prevented from being interrupted near the side surfaces of the gate electrode. The gate insulation film can be highly reliable and can have high dielectric voltage resistance. The thin film transistor can be highly reliable.

As described above, according to the present invention, the gate electrode is formed of an AlNd film, an Mo film containing nitrogen, which can be etched at a higher etching rate than the AlNd film, and an Mo film, which can be etched at a higher etching rate than the Mo film containing nitrogen, whereby the gate electrode can be formed with the side surfaces generally sloped. The gate insulation film, which is formed on such gate electrode, can be kept from interruption of film quality near the side surfaces of the gate electrode. According to the present invention, the gate insulation film can have high reliability and high dielectric voltage resistance. Accordingly, the thin film transistor can have high reliability.

According to the present invention, the same technique that is applied to the gate electrode is applied also to the source/drain electrodes, whereby the source/drain electrodes can be formed with the side surfaces generally sloped. The protection film is formed on such source/drain electrodes, whereby the protection film is kept from interruption of film quality near the side surfaces of the source/drain electrodes. Thus, according to the present invention, the protection film can have higher dielectric voltage resistance, which leads to higher reliability of liquid crystal display devices.

DETAILED DESCRIPTION OF THE INVENTION

Figure 1:
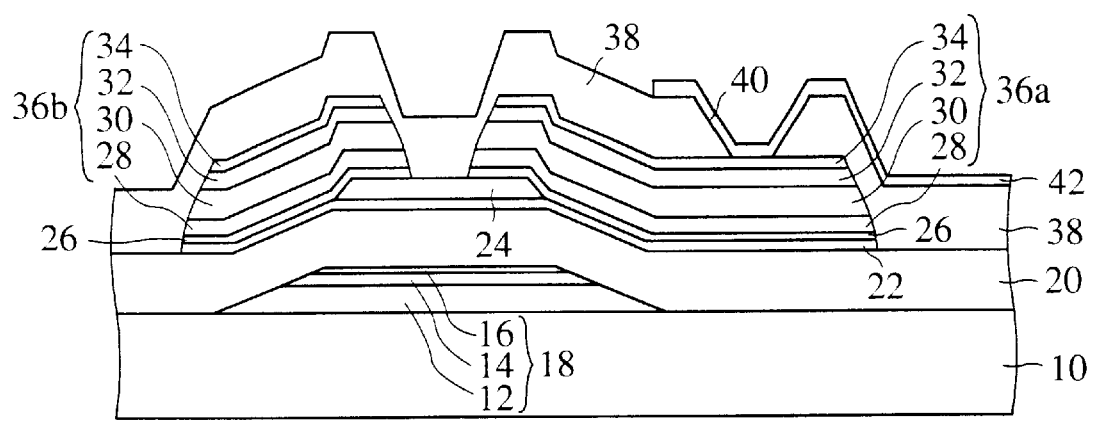
FIG. 1 is a sectional view of the thin film transistor according to one embodiment of the present invention.

The thin film transistor according to a first embodiment of the present invention and the method for fabricating the same will be explained with reference to FIGS. 1 to 10. FIG. 1 is a sectional view of the thin film transistor according to the present embodiment. FIGS. 2A to 9B are sectional view of the thin film transistor according to the present embodiment in the steps of the method for fabricating the same, which shows the method. FIG. 10 is a graph of results of reliability evaluation.

(Thin Film Transistor)

As shown in FIG. 1, on a glass substrate 10, a 150 nm-thickness AlNd (Nd: Neodymium) film 12 is formed with the side surfaces sloped. On the AlNd film 12, a 50 nm-thickness Mo film 14 containing nitrogen is formed with the side surfaces sloped. On the Mo film 14 containing nitrogen, a 30 nm-thickness Mo film 16 is formed.

The AlNd film 12, the Mo film 14 containing nitrogen and the Mo film 16 form a gate electrode 18. The Mo film 16 is not essentially sloped, but the Mo film 16 is so thin relative to a total thickness of the gate electrode 18 that the side surfaces of the gate electrode 18 are sloped as a whole.

A gate insulation film 20 is formed on the glass substrate 10 with the gate electrode 18 formed on. The gate insulation film 20, which is formed on the gate electrode 18 having the side surfaces sloped, has good film quality. Accordingly, the gate insulation film 20 can ensure higher dielectric voltage resistance.

A 30 nm-thickness amorphous silicon film 22 is formed on the gate insulation film 20. A channel protection film 24 of a 120 nm-thickness SiN film is formed on the amorphous silicon film 22. The side surfaces of the channel protection film 24 are sloped.

A 30 nm-thickness $n^+$-amorphous silicon film 26 is formed on the amorphous silicon film 22 with the channel protection film 24 formed on.

A 20 nm-thickness Ti film 28 is formed on the $n^+$-amorphous silicon film 26.

On the Ti film, a 150 nm-thickness Al film 30 is formed with the side surfaces sloped. On the Al film 30, a 50 nm-thickness Mo film 32 containing nitrogen is formed with the side surfaces sloped. A 30 nm-thickness Mo film 34 is formed on the Mo film 32 containing nitrogen.

The Ti film 28, the Al film 30, the Mo film 32 containing nitrogen and the Mo film 34 form a source electrode 36a and a drain electrode 36b. The Mo film 34 is not essentially sloped, but the Mo film 34 is so thin relative to the total thickness of the source/drain electrodes 36a, 36b that the source/drain electrodes 36a, 36b have the side surfaces sloped as a whole.

A protection film 38 of a 330 nm-thickness SiN film is formed on the entire surface. Because of the protection film 38 formed on the source/drain electrodes 36a, 36b having the side surfaces sloped, the protection film 38 has good film quality. Accordingly, the protection film 38 can ensure high dielectric voltage resistance.

A contact hole 40 arriving at the source electrode 36a is formed in the protection film 38. A picture element electrode 42 of a 70 nm-thickness ITO (Indium Tin Oxide) connected to the source electrode 36a through the contact hole 40 is formed on the protection film 38.

Thus, the thin film transistor according to he present embodiment is formed.

(Method for Fabricating the Thin Film Transistor)

Then, the method for fabricating the thin film transistor according to the present embodiment will be explained with reference to FIGS. 2A to 9B.

First, on the glass substrate 10, the 150 nm-thickness AlNd film 12 is formed by sputtering. As a target, an Al alloy containing Nd is used.

Then, the 50 nm-thickness Mo film 14 containing nitrogen is formed on the entire surface by reactive sputtering using $N_2$ gas. A target is formed of Mo. As a film forming condition, a flow rate ratio between Ar gas and $N_2$ gas is, e.g., 9:1. A nitrogen content in the Mo film 14 containing nitrogen is, e.g., 0.01 to 0.1 with respect to an Mo amount.

Next, the 30 nm-thickness Mo film 16 is formed on the entire surface by sputtering. Thus, the AlNd film 12, the Mo film 14 containing nitrogen, and the Mo film 16 form a multi-layer film 17 (see FIG. 2A).

Next, a photoresist film is formed on the entire surface by spin coating. Then, the photoresist film is patterned by photolithography. Thus, a photoresist mask 44 for patterning the gate electrode 18 is formed (see FIG. 2B).

Next, with the photoresist mask 44 as a mask, the AlNd film 12, the Mo film 14 containing nitrogen and the Mo film 16 are wet etched together. As an etchant, an aqueous solution of a mixture of, e.g., 67.3 wt % of phosphoric acid, 5.2 wt % of nitric acid, and 10 wt % of acetic acid is used. This etchant allows the Mo film 16 to be etched at a higher etching rate than the Mo film 14 containing nitrogen, and the Mo film 14 containing nitrogen to be etched at a higher etching rate than the AlNd film 12. Resultantly, the side surfaces of the AlNd film 12 and the Mo film 14 containing nitrogen can be sloped. Further, the gate electrode 18 can be formed, having the side surfaces sloped as a whole (see FIG. 2C).

The side surfaces of the Mo film 16 are not essentially sloped. In a case that the Mo film 16 is formed in an extreme thickness of above 30 nm, a ratio of the thickness of the Mo film 16 to a total thickness of the gate electrode 18 becomes higher, and the gate electrode 18 cannot have the side surfaces sloped as a whole. On the other hand, in a case that the Mo film 16 is formed in a smaller thickness of below 5 nm, the etchant cannot arrive the Mo film 16, and the side surfaces of the Mo film 14 containing nitrogen and the AlNd film 18 cannot be sloped. Accordingly, the gate electrode 18 cannot have the side surfaces sloped as a whole. In order to form the gate electrode 18 having the side surfaces sloped as a whole, it is preferable to set a thickness of the Mo film 16 to be, e.g., 5 to 30 nm.

Figure 2A:
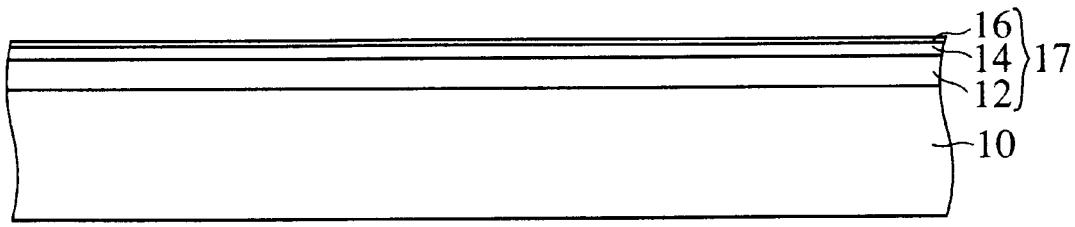
FIGS. 2A to 2D are sectional views of the thin film transistor according to the embodiment of the present invention in the steps of the method for fabricating the same, which explain the method (Part 1).
Figure 2B:
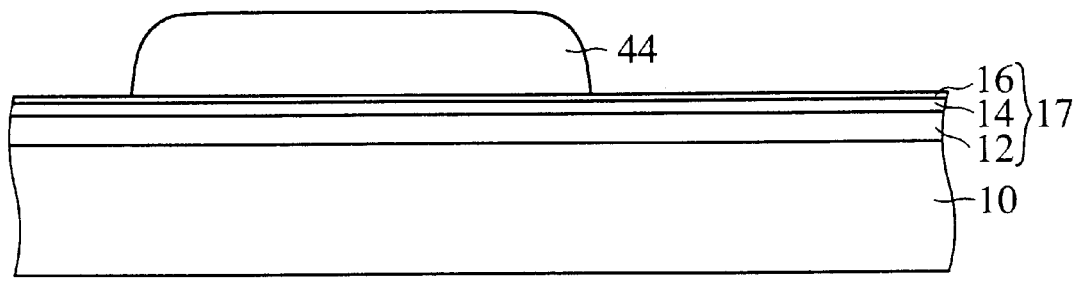
Figure 2C:
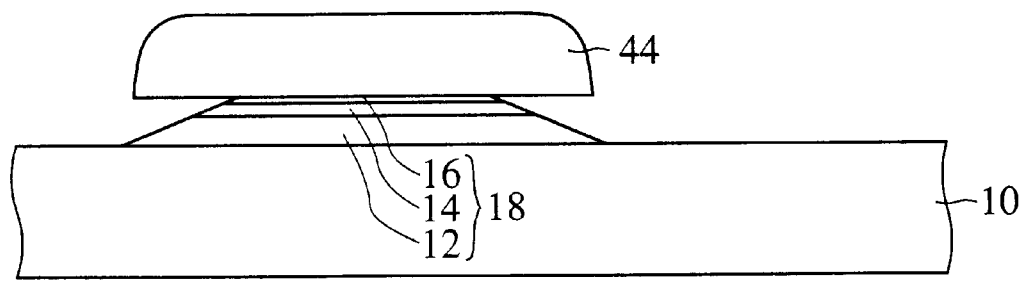
Figure 2D:
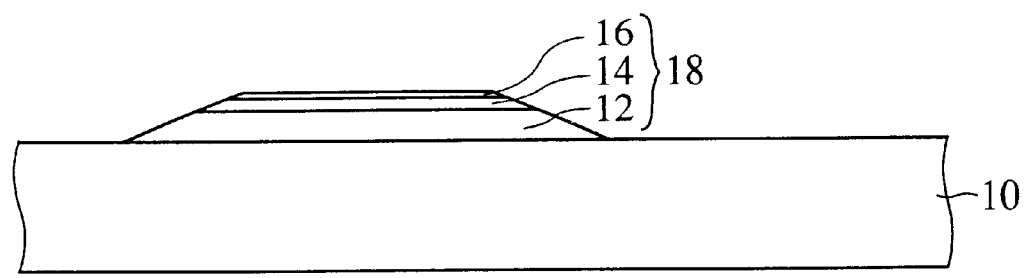

Next, the photoresist mask 44 is removed with a remover (see FIG. 2D).

Next, the gate insulation film 20 is formed of a 350 nm-thickness SiN film on the entire surface by plasma CVD (Plasma enhanced Chemical Vapor Deposition). The gate insulation film 20, which is formed on the gate electrode 18 having the side surfaces sloped as a whole, can have good film quality. The gate insulation film 20 can have high reliability and high dielectric voltage resistance.

Then, the 30 nm-thickness amorphous silicon film 22 is formed on the entire surface by plasma CVD.

Figure 3A:
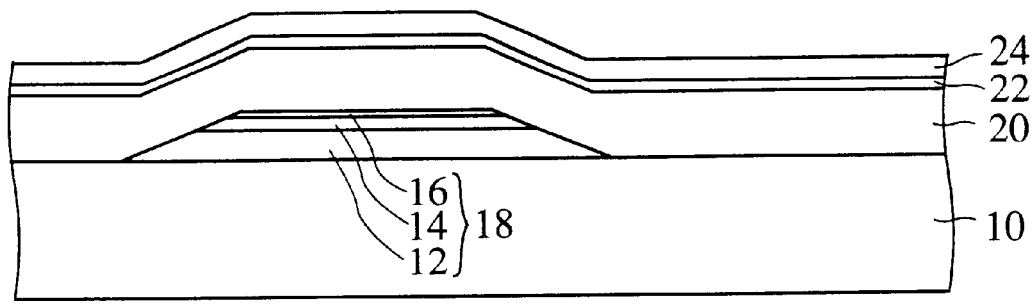
FIGS. 3A to 3C are sectional views of the thin film transistor according to the embodiment of the present invention in the steps of the method for fabricating the same, which explain the method (Part 2).
Figure 3B:
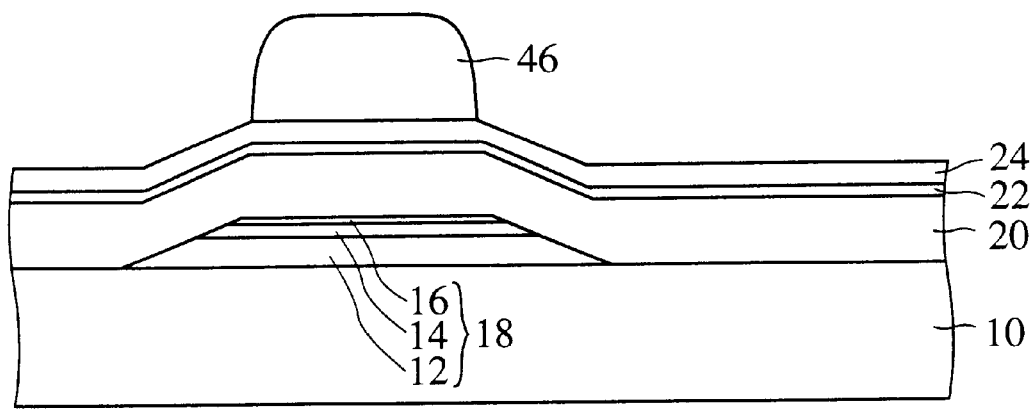

Then, the channel protection film 24 is formed of a 120 nm-thickness SiN film on the entire surface by plasma CVD (see FIG. 3A).

Then, a photoresist film is formed on the entire surface by spin coating. Then, the photoresist film is patterned by photolithography. Thus, the photoresist mask 46 for patterning the channel protection film 24 is formed (see FIG. 3B).

Figure 3C:
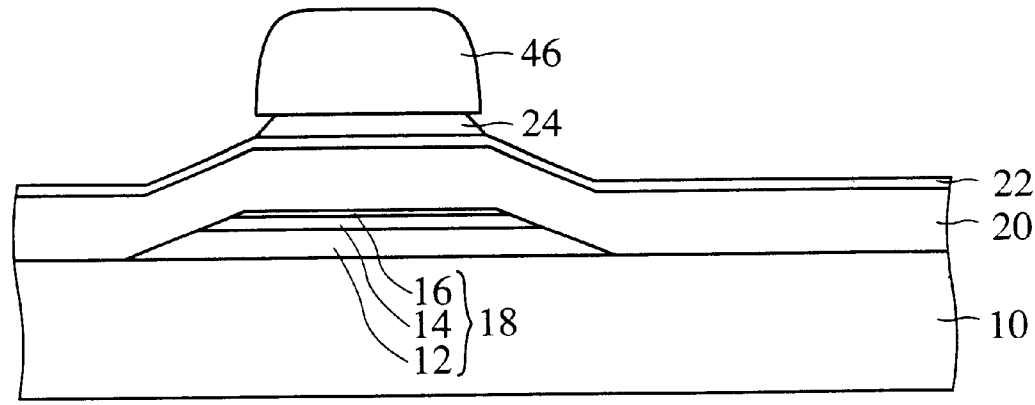

Then, the channel protection film 24 is etched by dry etching with the photoresist mask 46 as a mask (see FIG. 3C).

Figure 4A:
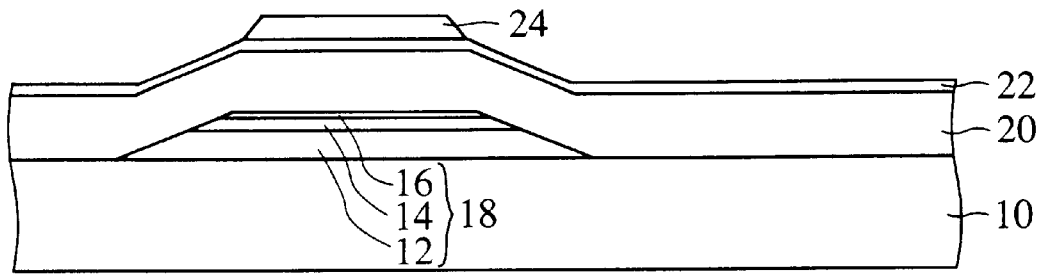
FIGS. 4A to 4C are sectional views of the thin film transistor according to the embodiment of the present invention in the steps of the method for fabricating the same, which explain the method (Part 3).
Figure 4B:
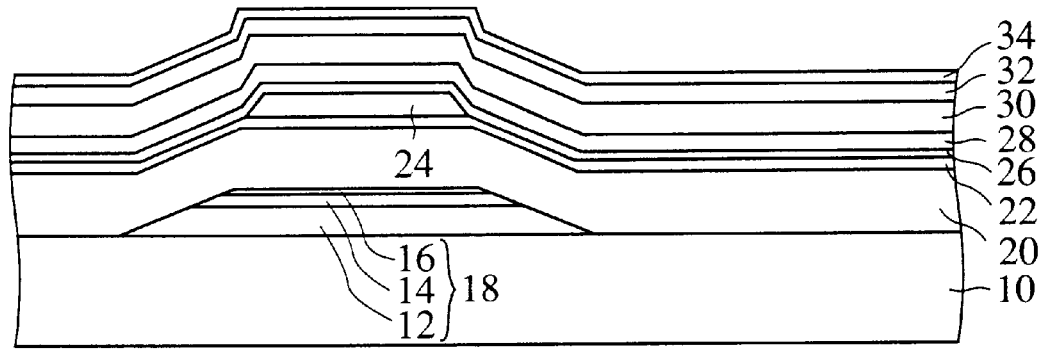
Figure 4C:
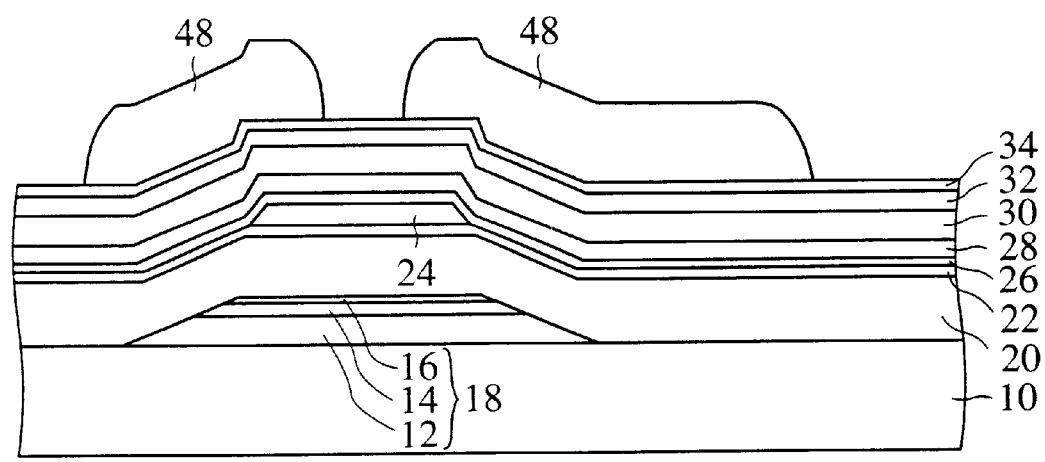

Next, the photoresist mask 46 is removed with a remover (see FIG. 4A).

Then, the $n^+$-amorphous silicon film 26 is formed by plasma CVD. Phosphorus is used as a dopant.

Next, the 20 nm-thickness Ti film is formed by sputtering.

Then, the 150 nm-thickness Al film 30 is formed by sputtering. A target is Al.

Then, the 50 nm-thickness Mo film 32 containing nitrogen. The Mo film 32 containing nitrogen is formed by, e.g., the same technique as the Mo film 14 containing nitrogen.

Next, the 30 nm-thickness Mo film 34 is formed by sputtering. The Mo film 34 is formed by, e.g., the same technique as the Mo film 16 (see FIG. 4B).

Next, a photoresist film is formed on the entire surface by spin coating. Then, the photoresist film is patterned by photolithography. Thus, a photoresist film 48 for patterning the source/drain electrodes 36a, 36b is formed (see FIG. 4C).

Then, with the photoresist mask 48 as a mask, the Mo film 34, the Mo film 32 containing nitrogen and the Al film 30 are etched together. An etchant is, e.g., an aqueous solution of a mixture of 67.3 wt % of phosphoric acid, 5.2 wt % of nitric acid and 10 wt % of acetic acid. This etchant allows the Mo film 34 to be etched at a higher etching rate than the Mo film 32 containing nitrogen, and the Mo film 32 containing nitrogen to be etched at a higher etching rate than the Al film 30. Resultantly, the side surfaces of the Al film 30 and the Mo film 32 containing nitrogen can be sloped as a whole (see FIG. 5A).

Figure 5A:
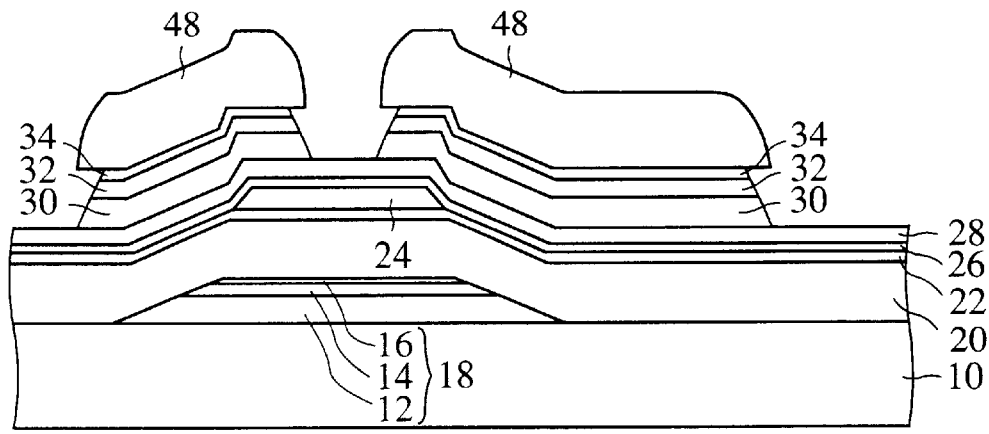
FIGS. 5A to 5C are sectional views of the thin film transistor according to the embodiment of the present invention in the steps of the method for fabricating the same, which explain the method (Part 4).
Figure 5B:
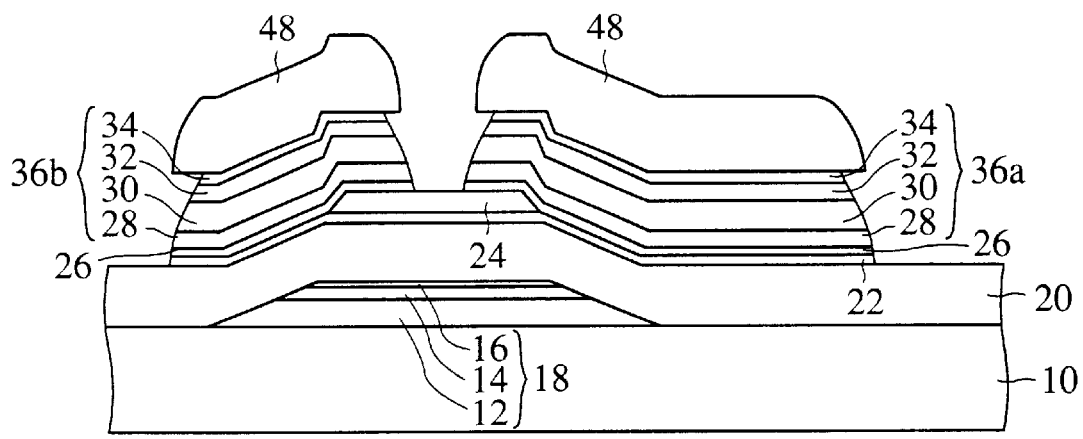

Then, with the Al film 30 as a mask, the Ti film 28, the $n_+$-amorphous silicon film 26 and the amorphous silicon film 22 are etched. Thus, the source/drain electrodes 36a, 36b having the side surfaces sloped as a whole can be formed (FIG. 5B).

Figure 5C:
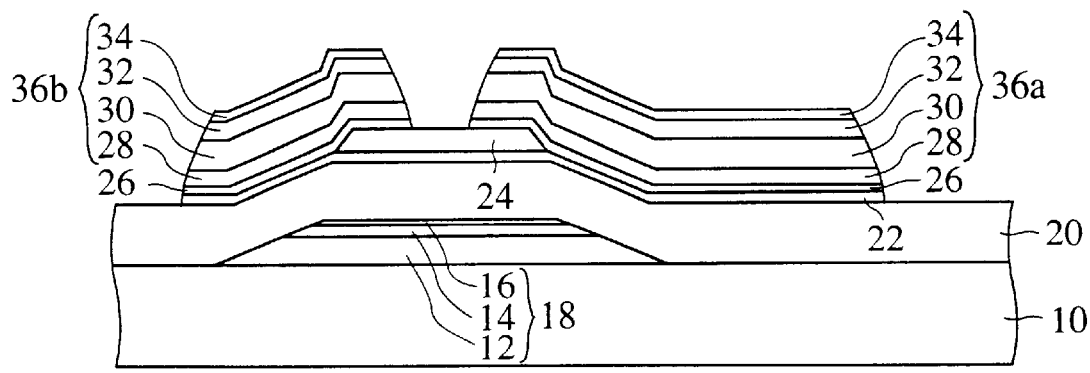
Figure 6A:
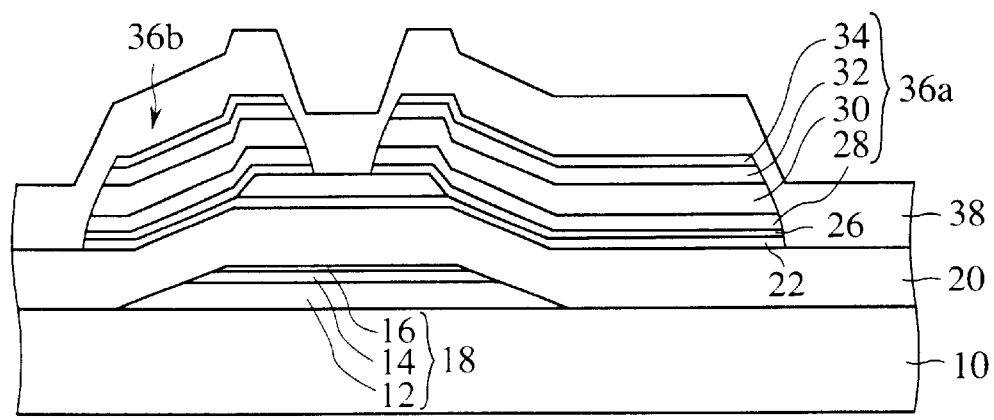
FIGS. 6A and 6B are sectional views of the thin film transistor according to the embodiment of the present invention in the steps of the method for fabricating the same, which explain the method (Part 5).
Figure 6B:
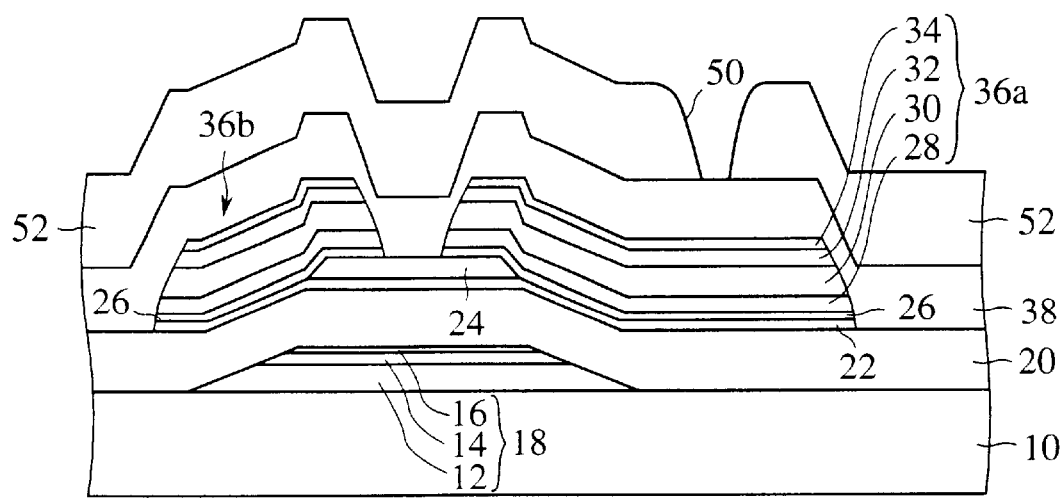

Next, the photoresist mask 48 is removed with a resist remover (see FIG. 5C).

Then, the protection film 38 of a 330 nm-thickness SiN film is formed by plasma CVD. The protection film 38, which is formed on the source/drain electrodes 36a, 36b having the side surfaces sloped as a whole, can have good film quality. Thus, the protection film 38 having high reliability and high dielectric voltage resistance can be formed (see FIG. 6A).

Next, a photoresist film is formed on the entire surface by spin coating. Then, the photoresist film is patterned by photolithography to form a photoresist mask 52 with an opening 50 formed in (see FIG. 6B).

Figure 7A:
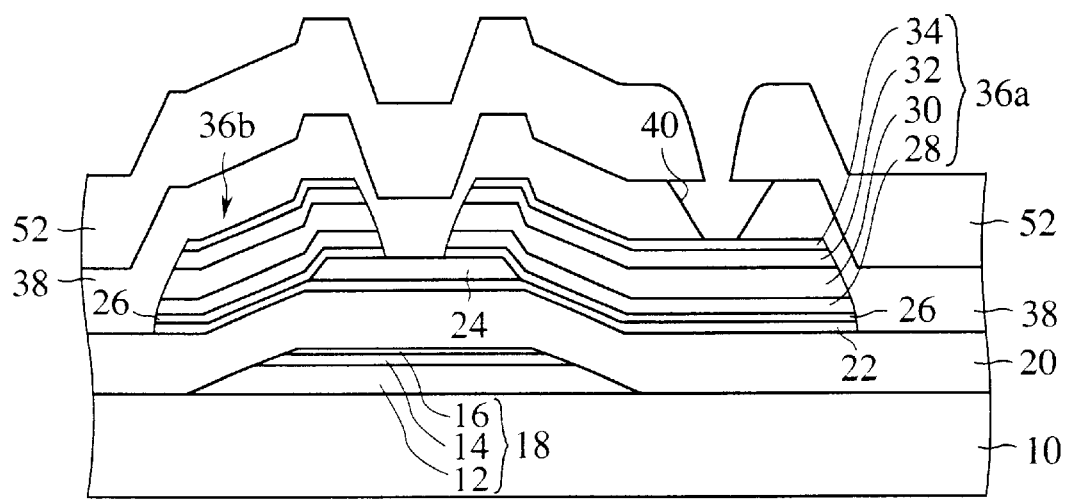
FIGS. 7A and 7B are sectional views of the thin film transistor according to the embodiment of the present invention in the steps of the method for fabricating the same, which explain the method (Part 6).

With the photoresist mask 52 as a mask, the protection film 38 is etched to form the contact hole 40 arriving at the source electrode 36a (see FIG. 7A).

Figure 7B:
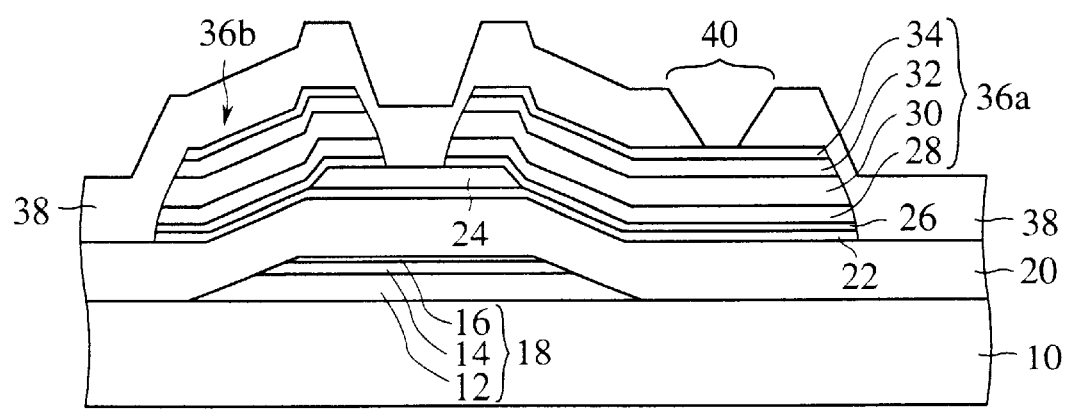

Then, the photoresist mask 52 is removed with a resist remover (see FIG. 7B).

Figure 8A:
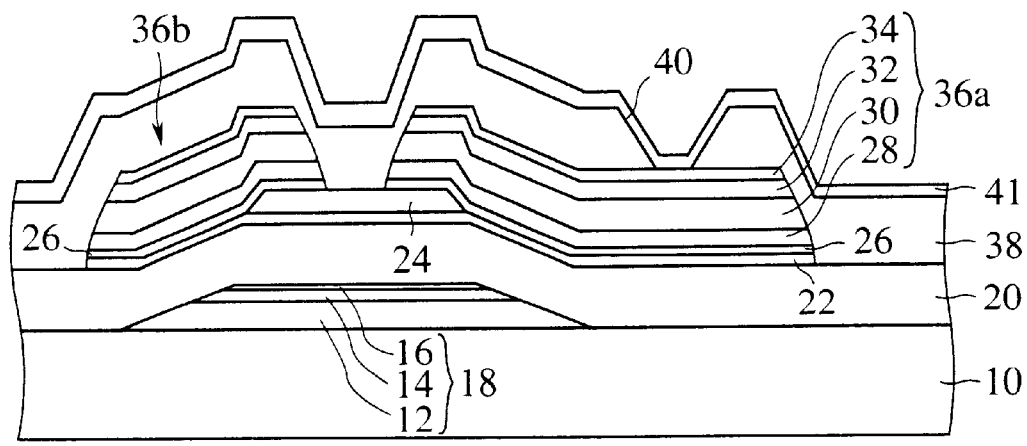
FIGS. 8A and 8B are sectional views of the thin film transistor according to the embodiment of the present invention in the steps of the method for fabricating the same, which explain the method (Part 7).
Figure 8B:
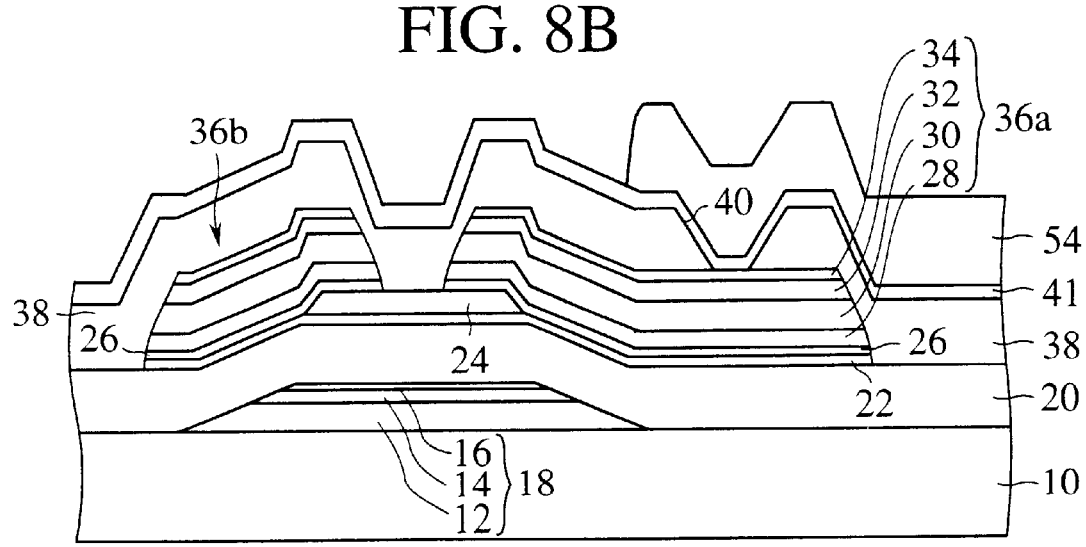

Then the 70 nm-thickness ITO (Indium Tin Oxide) film 41 is formed on the entire surface by sputtering (see FIG. 8a).

Next, photoresist film is formed on the entire surface by spin coating. Next, the photoresist film is patterned by photolithography. Thus, a photoresist mask 54 for forming a picture element electrode 42 is formed (see FIG. 8B).

Figure 9A:
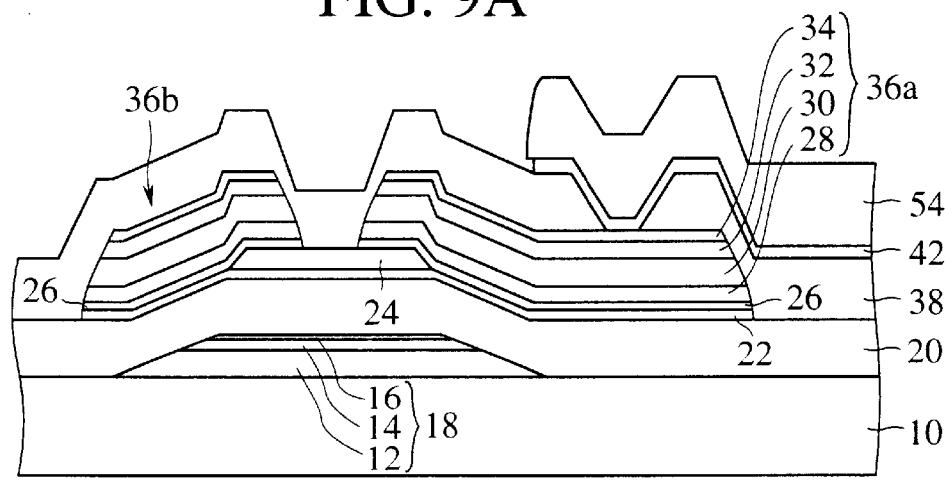
FIGS. 9A and 9B are sectional views of the thin film transistor according to the embodiment of the present invention in the steps of the method for fabricating the same, which explain the method (Part 8).
Figure 10:
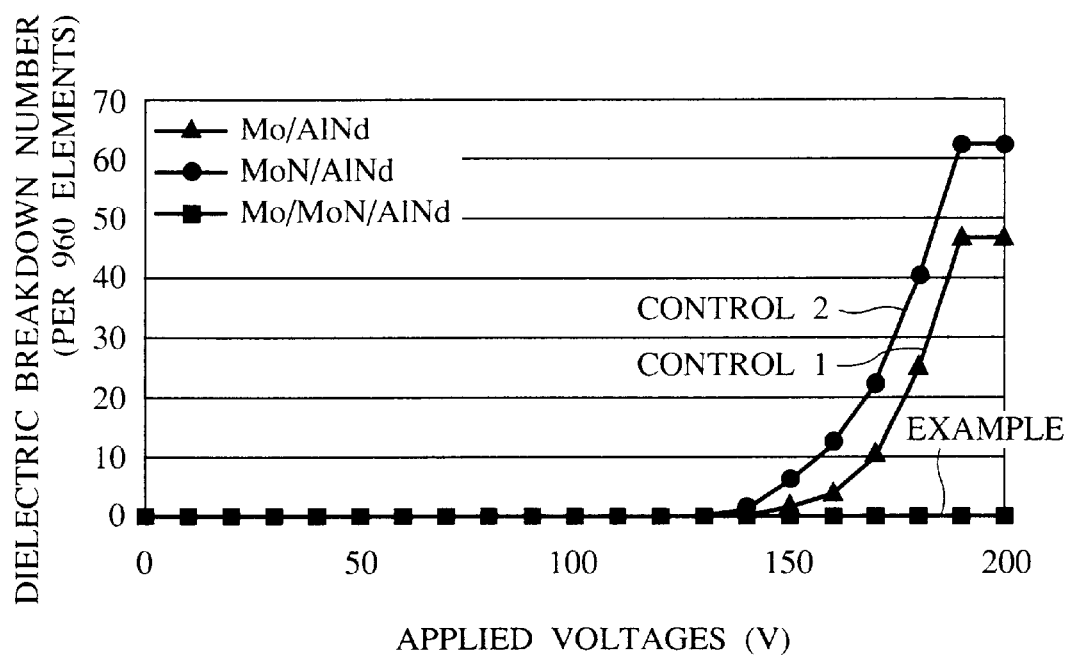
FIG. 10 is a graph of reliability evaluation results.

Next, with the photoresist mask 54 as a mask, the ITO film 41 is etched to form the picture element electrode 42 of the ITO (see FIG. 9A).

Figure 9B:
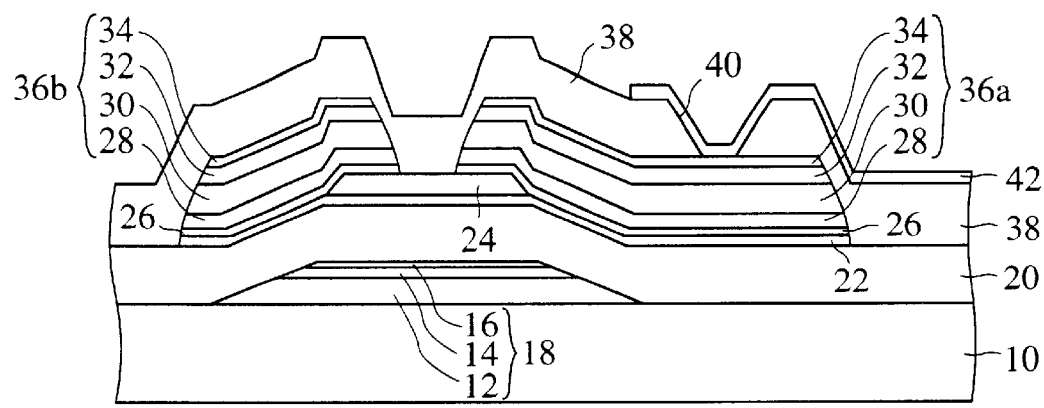

Next, the photoresist mask 54 is removed with a resist remover (see FIG. 9B). Thus, the thin film transistor according to the present embodiment is fabricated.

(Reliability Evaluation Results)

Results of reliability evaluation of the thin film transistor according to the present embodiment will be explained with reference to FIG. 10. An insulation film was formed on a 960-TEG (Test Element Group), and voltages were applied to the insulation film, and test elements which had insulation defects were measured. FIG. 10 shows the measured numbers corresponding to the applied voltages.

In the Example, the thin film transistor according to the present embodiment, which includes the gate electrode formed of Mo/MoN/AlNd was tested.

Figure 11A:
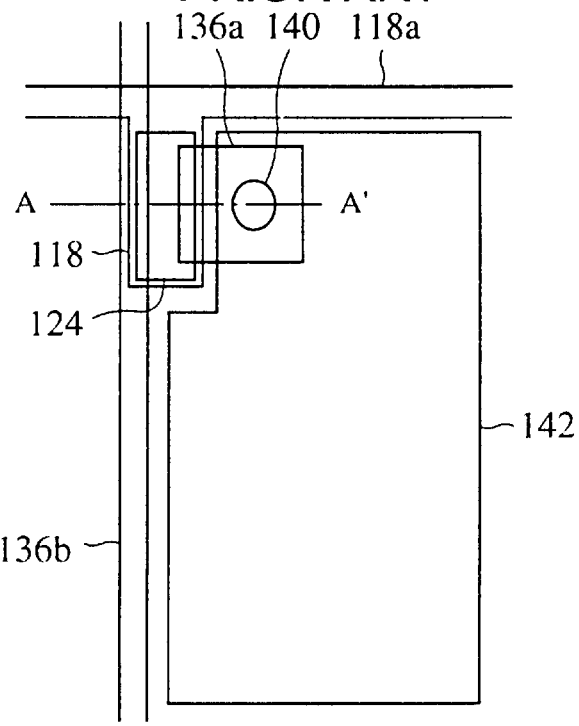
FIG. 11A is a plan view of the conventional liquid crystal display device.
Figure 11B:
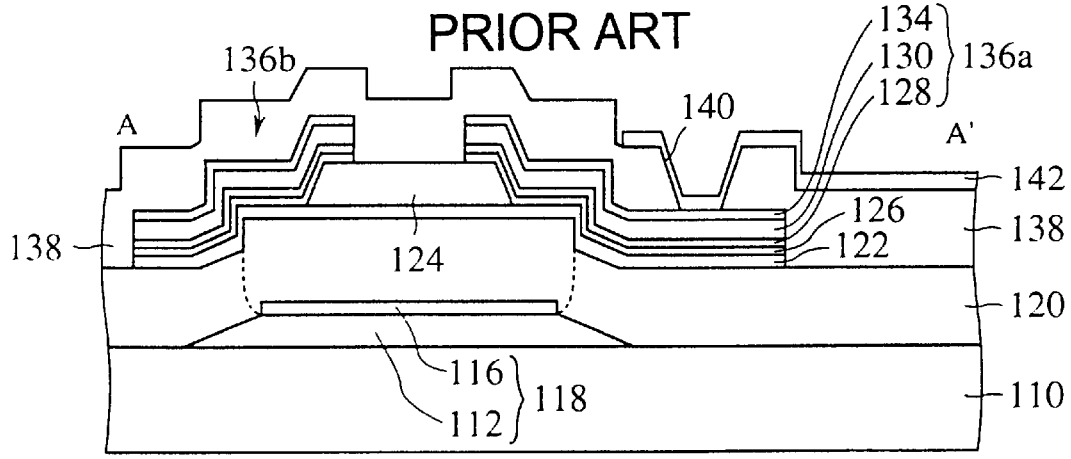
FIG. 11B is a sectional view of the conventional liquid crystal display device.

In Control 1, the thin film transistor shown in FIGS. 11A and 11B, which includes the gate electrode formed of Mo/AlNd was tested. In Control 2, a thin film transistor includes the gate electrode formed of MoN/AlNd.

As seen in FIG. 10, in Controls 1 and 2, insulation detects took place at applied voltages of above about 150 V.

In contrast to this, in the Example, no insulation defect took place at a 200 V applied voltage. Based on this, the present embodiment shows that even in a case that low resistance wiring, as of AlNd, is used, an insulation film of high reliability and high dielectric voltage resistance can be formed.

As described above, according to the present embodiment, the gate electrode is formed of an AlNd film, an Mo film containing nitrogen, which can be etched at a higher etching rate than the AlNd film, and an Mo film, which can be etched at a higher etching rate than the Mo film containing nitrogen, whereby the gate electrode can be formed with the side surfaces sloped as a whole. The gate insulation film, which is formed on such gate electrode, can be kept from interruption of film quality near the side surfaces of the gate electrode. According to the present embodiment, the gate insulation film can have high reliability and high dielectric voltage resistance. Accordingly, the thin film transistor can have high reliability.

According to the present embodiment, the same technique that is applied to the gate electrode is applied also to the source/drain electrodes, whereby the source/drain electrodes can be formed with the side surfaces sloped as a whole. The protection film is formed on such source/drain electrodes, whereby the protection film is kept from interruption of film quality near the side surfaces of the source/drain electrodes. Thus, according to the present embodiment, the protection film can have higher dielectric voltage resistance, which leads to higher reliability of liquid crystal display devices.

[Modifications]

The present invention is not limited to the above-described embodiment and covers other various modification.

For example, in the above-described embodiment, the Mo film containing nitrogen, and the Mo film are separately formed, but they may be continuously formed. That is, a film of the Mo film as an upper layer and the Mo film containing nitrogen as a lower layer may be formed. Such film can be formed by first forming the Mo film containing nitrogen by sputtering at, e.g., a 9:1 flow rate ratio between Ar gas and $N_2$ gas, and then forming the Mo film with the sputtering set on and with the feed of the $N_2$ gas stopped.

In the above-described embodiment, the AlNd film has a 150 nm-thickness, and the Mo film containing nitrogen has a 50 nm-thickness, but these film thicknesses are not essential. A film thickness of the AlNd film and a film thickness of the Mo film containing nitrogen may be suitably set so that the latter is, e.g., about 0.1 to 0.7 times the former, preferably about 0.3 to 0.5 times the former.

In the above-described embodiment, the gate electrode includes the AlNd film 12. The AlNd film is not essential and may includes Al film. An Al alloy containing at least one element of Sc (Scandium), Ta, Zr (Zirconium), Y (Yttrium), Ni, Nb (Niobium) and B may be used.

In the above-described embodiment, the source/drain electrodes 36a, 36b are formed of the Al film 30, but may be formed of AlNd. An Al alloy containing at least one element of Sc, Ta, Zr, Y, Ni, Nb and B may be used.

In the above-described embodiment, the AlNd film 12 and the Al film 30 are used, but they are not essential. Cu, Ag or others may be used. An alloy film containing Cu as a main component, an alloy film containing Ag as a main component, or others may be used.

In the above-described embodiment, the Mo film is used, but the Mo film is not essential. An alloy containing Mo as a main component, e.g., Mo containing Ta, Mo containing W (tungsten), others may be used.

What is claimed is:

1. A thin film transistor comprising a gate electrode formed on a substrate, a gate insulation film formed on the gate electrode, a semiconductor layer formed on the gate insulation film, and a source electrode and a drain electrode formed on the semiconductor layer, the gate electrode, the source electrode or the drain electrode including a first conductor film, a second conductor film formed on the first conductor film, and a third conductor film formed on the second conductor film;

the first conductor film being formed of a metal selected out of Al, Cu and Ag, or an alloy of a metal, as a main component, selected out of Al, Cu and Ag, and having side surfaces sloped;

the second conductor film being formed of a film of Mo containing nitrogen, or an alloy of Mo containing nitrogen, and having side surfaces sloped; and the third conductor film being formed of Mo, or an alloy of Mo as a main component.

2. A thin film transistor according to claim 1, wherein a film thickness of the second conductor film is 0.1 to 0.7 times a film thickness of the first conductor film.

3. A thin film transistor according to claim 1, wherein a film thickness of the third conductor film is 5 to 30 nm.

4. A thin film transistor according to claim 2, wherein a film thickness of the third conductor film is 5 to 30 nm.

5. A thin film transistor comprising a gate electrode formed on a substrate, a gate insulation film formed on the gate electrode, a semiconductor layer formed on the gate insulation film, and a source electrode and a drain electrode formed on the semiconductor layer, the gate electrode, the source electrode or the drain electrode including a first conductor film, and a second conductor film formed on the first conductor film;

the first conductor film being formed of a metal selected out of Al, Cu and Ag, or an alloy of a metal, as a main component, selected out of Al, Cu and Ag, and having side surfaces sloped;

the second conductor film including a lower layer formed of a film of Mo containing nitrogen or an alloy of Mo, as a main component, containing nitrogen, and an upper layer formed of a film of Mo or an alloy of Mo, as a main component, and side surfaces of the lower layer being sloped.

6. A thin film transistor according to claim 1, wherein the alloy of Al as a main component contains Nd, Sc, Ta, Zr, Y, Ni, Nb or B.

7. A thin film transistor according to claim 2, wherein the alloy of Al as a main component contains Nd, Sc, Ta, Zr, Y, Ni, Nb or B.

8. A thin film transistor according to claim 3, wherein the alloy of Al as a main component contains Nd, Sc, Ta, Zr, Y, Ni, Nb or B.

9. A thin film transistor according to claim 4, wherein the alloy of Al as a main component contains Nd, Sc, Ta, Zr, Y, Ni, Nb or B.

10. A thin film transistor according to claim 5, wherein the alloy of Al as a main component contains Nd, Sc, Ta, Zr, Y, Ni, Nb or B.

11. A method for fabricating a thin film transistor comprising the steps of forming a gate electrode on a substrate, forming an gate insulation film on the gate electrode, forming a semiconductor layer on the gate insulation film, and forming a source electrode and a drain electrode on the semiconductor layer, the step of forming the gate electrode, or the step of forming the source electrode and a drain electrode including the steps of:

forming a first conductor film of a metal selected out of Al, Cu and Ag, or an alloy of a metal, as a main component, selected out of Al, Cu and Ag;

forming a second conductor film of Mo containing nitrogen or an alloy of Mo, as a main component, containing nitrogen;

forming a third conductor film of Mo or an alloy of Mo as a main component; and etching the second conductor film at a higher etching rate than the first conductor film, and etching the third conductor film at a higher etching rate than the second conductor film to thereby slope side surfaces of the first conductor film and of the second conductor film.

12. A method for fabricating a thin film transistor comprising the steps of forming a gate electrode on a substrate, forming an gate insulation film on the gate electrode, forming a semiconductor layer on the gate insulation film, and forming a source electrode and a drain electrode on the semiconductor layer, the step of forming the gate electrode, or the step of forming the source electrode and the drain electrode including the steps of:

forming a first conductor film of a metal selected out of Al, Cu and Ag, or an alloy of a metal, as a main component, selected out of Al, Cu and Ag;

forming a second conductor film including a lower layer of Mo containing nitrogen or an alloy of Mo, as a main component, containing nitrogen, and an upper layer of Mo or an alloy of Mo as a main component; and etching the lower layer of the second conductor film at a higher etching rate than the first conductor film, and etching the upper layer of the second conductor film at a higher etching rate than the lower layer of the second conductor film to thereby slope side surfaces of the first conductor film and side surfaces of the lower layer of the second conductor film.

13. A method for fabricating a thin film transistor according to claim 11, wherein in the step of forming the second conductor film, the second conductor film contains nitrogen by 0.01 to 0.1 of an Mo amount is formed.

14. A method for fabricating a thin film transistor according to claim 12, wherein in the step of forming the second conductor film, the lower layer contains nitrogen by 0.01 to 0.1 of an Mo amount is formed.

* * * * *